United States Patent
Guo et al.

(10) Patent No.: US 9,209,605 B1
(45) Date of Patent: Dec. 8, 2015

(54) LASER DIODE SUBASSEMBLY AND METHOD OF GENERATING LIGHT

(71) Applicant: JDS Uniphase Corporation, Milpitas, CA (US)

(72) Inventors: James Yonghong Guo, Union City, CA (US); Lei Xu, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 14/603,742

(22) Filed: Jan. 23, 2015

(51) Int. Cl.
| | |
|---|---|
| H01S 5/00 | (2006.01) |
| H01S 5/40 | (2006.01) |
| H01S 5/125 | (2006.01) |
| H01S 5/068 | (2006.01) |
| H01S 5/0625 | (2006.01) |
| H01S 5/14 | (2006.01) |

(52) U.S. Cl.
CPC ........... *H01S 5/4012* (2013.01); *H01S 5/06256* (2013.01); *H01S 5/06821* (2013.01); *H01S 5/125* (2013.01); *H01S 5/141* (2013.01); *H01S 5/4018* (2013.01); *H01S 5/4087* (2013.01)

(58) Field of Classification Search
USPC ........ 372/29.02, 29.022, 43.01, 50.11–12, 92
See application file for complete search history.

(56) References Cited

U.S. PATENT DOCUMENTS

| | | | |
|---|---|---|---|
| 5,761,234 A | 6/1998 | Craig et al. | 372/75 |
| 5,841,797 A | 11/1998 | Ventrudo et al. | 372/6 |
| 6,192,062 B1 | 2/2001 | Sanchez-Rubio et al. | 372/92 |
| 6,208,679 B1 | 3/2001 | Sanchez-Rubio et al. | 372/92 |
| 6,212,310 B1 | 4/2001 | Waarts et al. | 385/24 |
| 7,010,194 B2 | 3/2006 | Anikitchev et al. | 385/36 |
| 7,199,924 B1 | 4/2007 | Brown et al. | 359/556 |
| 7,609,743 B2 | 10/2009 | Glebov et al. | 372/92 |
| 8,419,188 B2 | 4/2013 | Sprowl et al. | 353/31 |
| 8,427,749 B2 | 4/2013 | Du et al. | 359/629 |
| 8,526,110 B1 * | 9/2013 | Honea et al. | 359/556 |
| 8,724,222 B2 | 5/2014 | Chann et al. | 359/621 |
| 8,824,049 B2 | 9/2014 | Chann et al. | 359/556 |
| 2007/0002925 A1 | 1/2007 | Zediker et al. | 372/98 |
| 2010/0110556 A1 | 5/2010 | Chann et al. | 359/619 |
| 2011/0305256 A1 | 12/2011 | Chann et al. | 372/75 |
| 2014/0029641 A1* | 1/2014 | Volodin et al. | 372/102 |
| 2014/0247854 A1* | 9/2014 | Volodin | 372/50.123 |

* cited by examiner

*Primary Examiner* — Dung Nguyen
(74) *Attorney, Agent, or Firm* — Harrity & Harrity, LLP

(57) ABSTRACT

A laser diode subassembly is disclosed, in which dichroic reflectors are disposed sequentially one after another forming an array or stack, each reflector having a sequential array index. An array of laser diode emitters is provided, each emitter having a sequential array index. Individual reflectors of the array redirect laser sub-beams from individual laser diode emitters having same array indices, to propagate via dichroic reflectors having higher array indices, so as to form a combined optical beam. A common partial reflector may be used for the laser diode emitters instead of individual wavelength selective reflectors for each laser diode emitter.

20 Claims, 5 Drawing Sheets

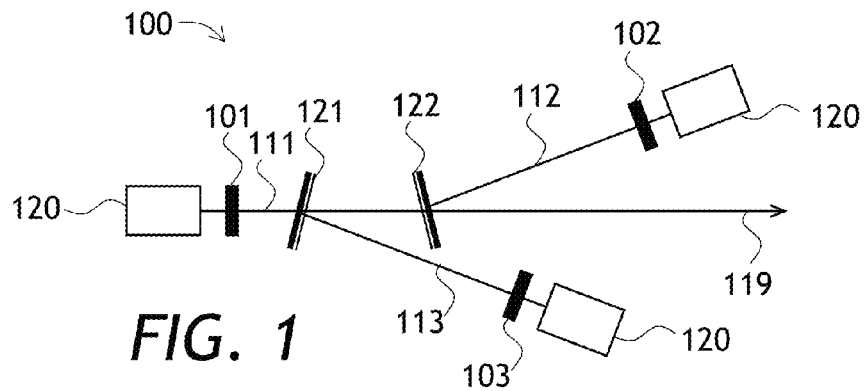
FIG. 1
Prior Art
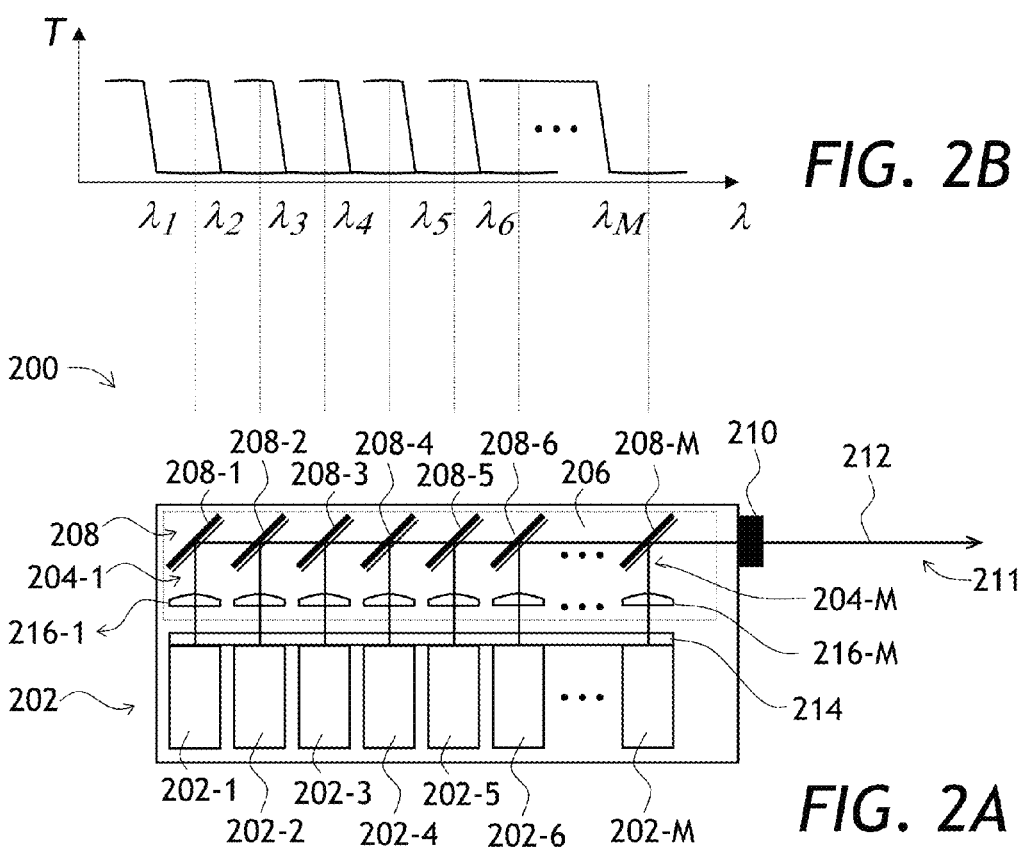
FIG. 2B
FIG. 2A

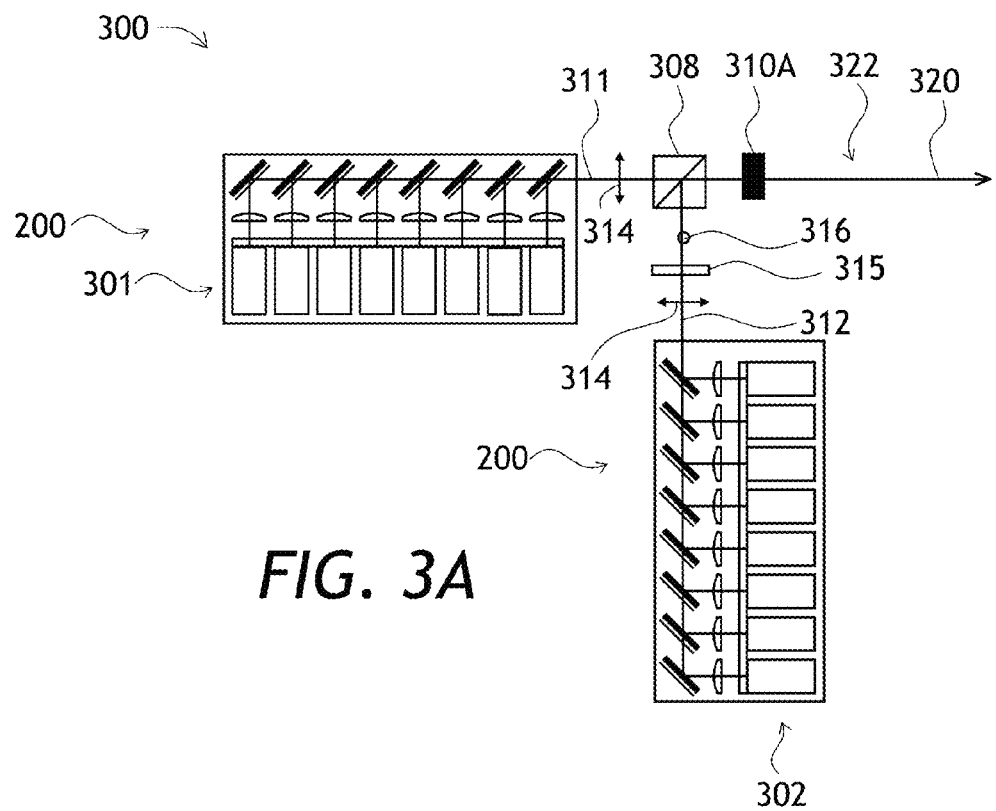
FIG. 3A
FIG. 3B
FIG. 3C

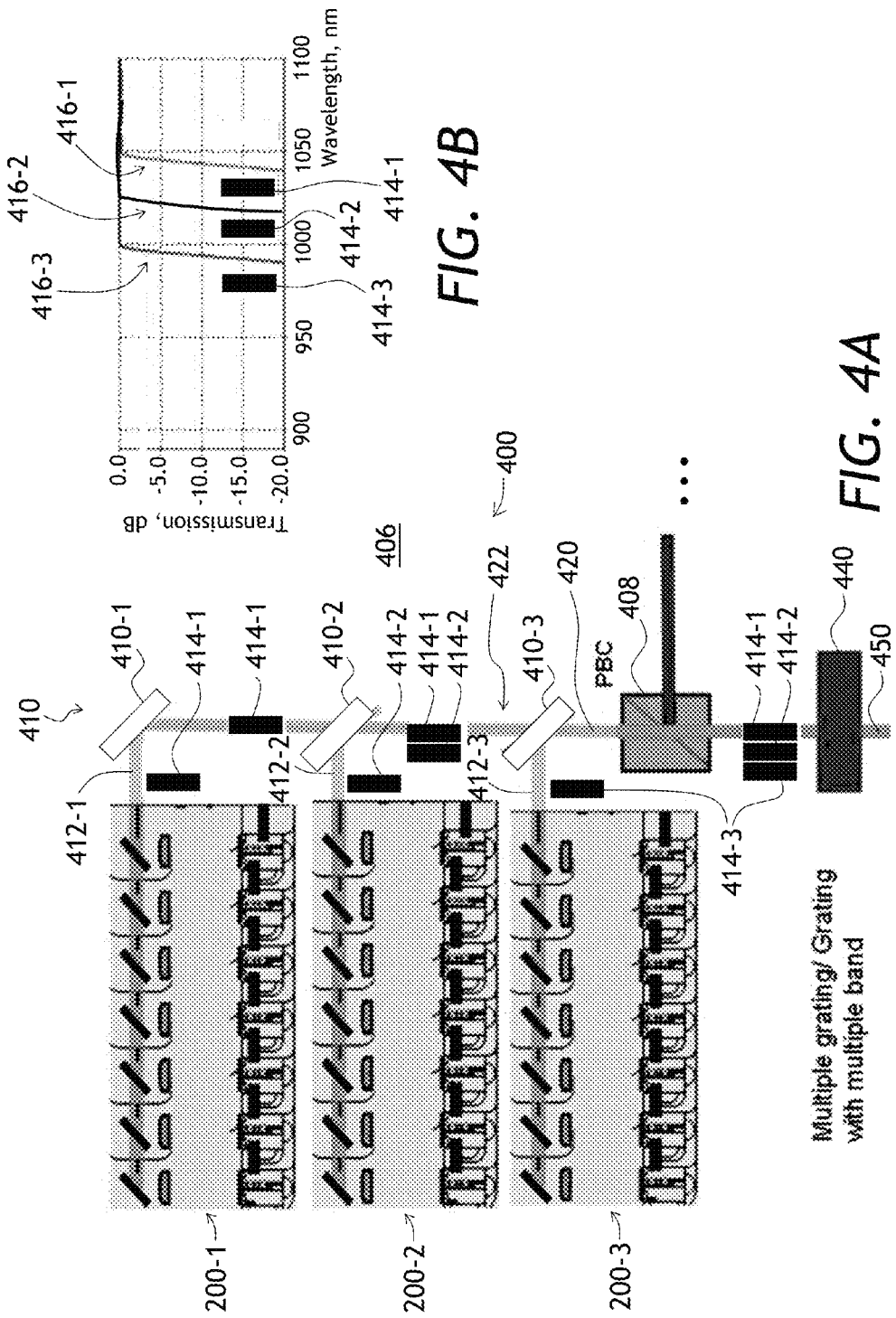

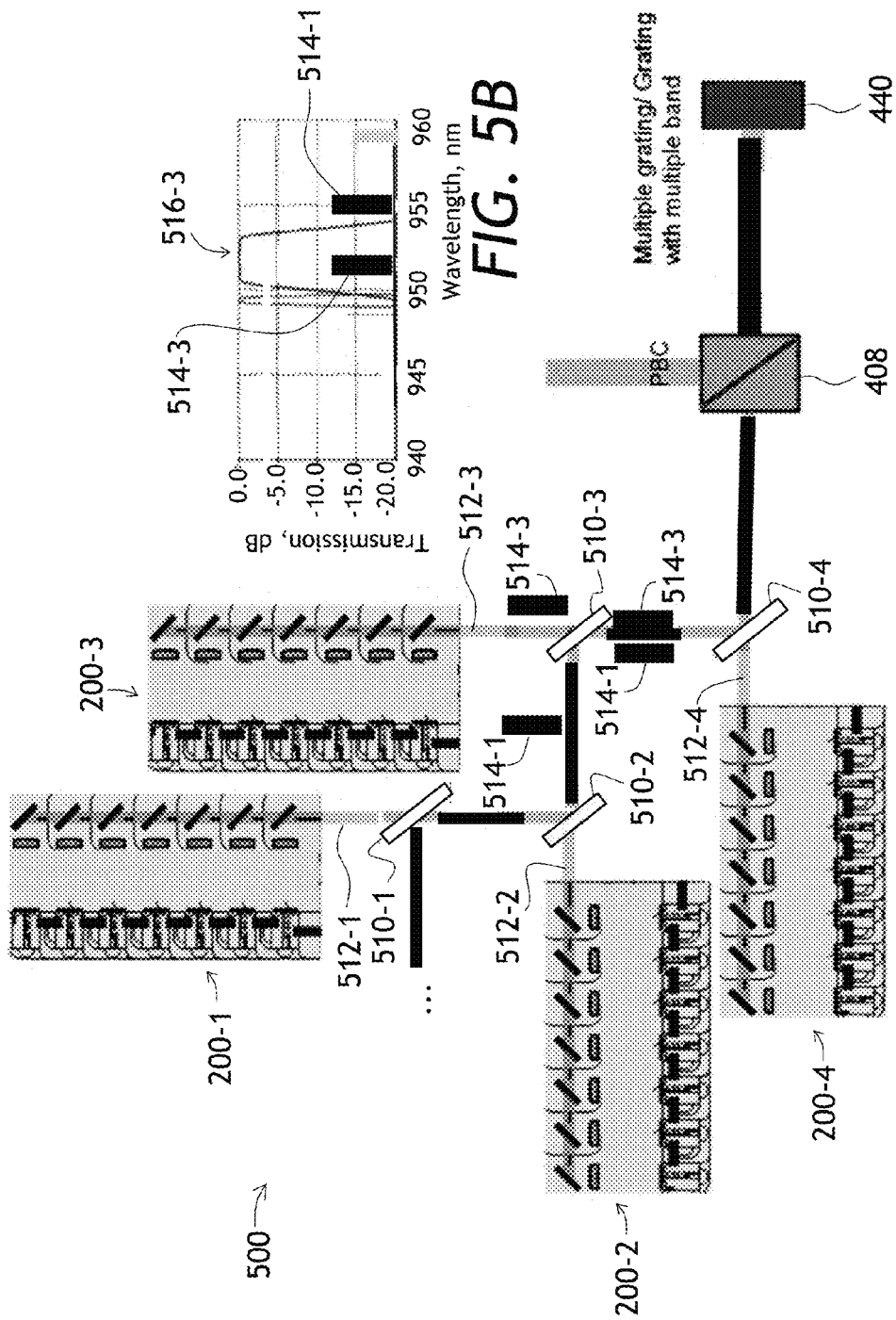

LASER DIODE SUBASSEMBLY AND METHOD OF GENERATING LIGHT

TECHNICAL FIELD

The present disclosure relates to light sources, and in particular to laser diode light sources and methods of light generation using the same.

BACKGROUND

A laser diode is a semiconductor diode, the p-n junction of which functions as a laser gain medium. To obtain population inversion in the gain medium, a forward current is applied to the p-n junction. Cleaved or polished facets of the laser diode chip may be used to form a laser cavity. An external mirror and/or a Bragg reflector may also be used for this purpose.

Laser diodes are inexpensive and efficient sources of coherent light at high power density and brightness. Laser diodes are widely used in electro-optical devices ranging from CD players to concrete-cutting industrial lasers. In industrial lasers, laser diodes are frequently employed as a pump source for rare earth doped optical fibers or rods. Laser diodes are also widespread in optical fiber amplifiers, where they are used to pump erbium doped optical fibers.

Concentrating laser diode light enables brighter, more powerful light sources. By way of example, one may increase an effectiveness of laser diode fiber coupling by using beam forming and directing optics to stack laser beams generated by individual laser chips on top of one another to better fill the optical fiber's circular input aperture. Alternatively or in addition, individual laser beams may be overlapped to co-propagate in space; however for the laser beams to be efficiently overlapped, they must differ in some property, such as wavelength or polarization. When the beams are overlapped, the brightness of the resulting beam is increased. Increasing brightness of laser diode light sources is important for many applications, including pumping of fiber lasers and processing of materials directly with diode radiation.

Emission of laser diodes at different wavelengths may be combined using dichroic mirrors. Referring to FIG. 1, a prior-art laser diode light source 100 includes laser diode emitters 120, external volume Bragg reflectors (VBG) 101, 102, and 103 for providing an optical feedback to the laser diode emitters 120 at different respective wavelengths $\lambda_1$, $\lambda_2$, and $\lambda_3$ within a spectral gain band of the laser diode emitters 120 to generate first 111, second 112, and third 113 laser beams at the respective wavelengths $\lambda_1$, $\lambda_2$, and $\lambda_3$. First 121 and second 122 dichroic mirrors combine the laser beams 111, 112, and 113 to obtain an output laser beam 119. In the example shown, the first dichroic mirror 121 transmits the first laser beam 111 at the first wavelength $\lambda_1$, while reflecting the third laser beam 113 at the third wavelength $\lambda_3$. The second dichroic mirror 122 transmits the first laser beam 111 at the first wavelength $\lambda_1$ and the third wavelength $\lambda_3$, but reflects the second laser beam 112 at the second wavelength $\lambda_2$.

One drawback of the laser diode light source 100 is bulkiness. For the first 121 and second 122 dichroic mirrors to reflect light in wavelength-selective manner in both polarizations of light, angles of incidence of the respective third 113 and second 112 laser beams on the first 121 and second 122 dichroic mirrors need to be small, e.g. 12-25 degrees, precluding close placement of the first 121 and second 122 dichroic mirrors. Another drawback is related to having the individual VBG 101 to 103 for each laser diode emitter 120, increasing the cost of the laser diode light source 100. Both drawbacks may become more prevalent as one scales the power up by increasing the number of individual laser diode emitters 120 in the laser diode light source 100.

SUMMARY

In accordance with the present disclosure, dichroic reflectors may be disposed sequentially one after another, forming an array or stack. Each reflector may have a sequential array index. An array of laser diode emitters may be provided. Each emitter may have a sequential array index. The array indices are assigned in the present disclosure for explanation and identification purposes, and need not be printed or otherwise physically present on the components. Individual reflectors of the array redirect laser sub-beams from individual laser diode emitters having same array indices, to propagate via dichroic reflectors having higher array indices, if any, so as to form a combined optical beam. In other words, the individual reflectors transmit light sub-beams from other laser diode emitters having lower array indices, if any.

The dichroic reflectors may operate in a single polarization, allowing compact placement of the reflectors and laser diode emitters, e.g. at 45±10 degrees angle of incidence. A common partial reflector may be used for the laser diode emitters instead of individual wavelength selective reflectors for each laser diode emitter. The common partial reflector may include a partially reflecting mirror, which needs not be wavelength selective for cases where the wavelength selecting is performed or facilitated by the array of dichroic reflectors.

In accordance with the present disclosure, there is provided a laser diode subassembly comprising:

an array of M laser diode emitters disposed for emitting M light sub-beams propagating in a common first plane, wherein each laser diode emitter has a sequential array index from 1 to M in the array of M laser diode emitters;

an array of M dichroic reflectors, wherein each dichroic reflector has a sequential array index from 1 to M in the array of M dichroic reflectors, wherein each dichroic reflector is disposed in the first plane to reflect the light sub-beam of the laser diode emitter having the same array index and to transmit light sub-beams from other laser diode emitters having lower array indices, if any, thereby forming an optical beam, wherein the M dichroic reflectors comprise low-pass reflectors or high-pass reflectors, each dichroic reflector having a corresponding edge wavelength, wherein the edge wavelengths of the M dichroic reflectors are monotonically increasing or decreasing, respectively, with the dichroic reflector's array index; and a partial reflector disposed downstream of the array of M dichroic reflectors in an optical path of the optical beam and arranged to reflect a portion of each light sub-beam comprising the optical beam to propagate back to its originating laser diode emitter, thereby forming a laser cavity for each one of the M laser diode emitters.

In one embodiment of the subassembly, the partial reflector may include a partially reflecting mirror, which may have a flat spectral response.

In accordance with one embodiment, there is further provided a laser diode assembly comprising two laser diode subassemblies described above, wherein in operation, a first one of corresponding two arrays of M laser diode emitters forms a first optical beam, and a second one of the corresponding two arrays of M laser diode emitters forms a second optical beam;

an optical combiner for combining the first and second optical beams into a combined beam; and a common partial reflector instead of the partial reflectors of the two laser diode subassemblies, wherein the common partial reflector is disposed in an optical path of the combined beam downstream of the optical combiner for retroreflecting each light sub-beam, thereby forming a laser cavity for each laser diode emitter of the first and second arrays of M laser diode emitters.

In some embodiments, the optical combiner may include a bandpass dichroic mirror or a polarization beam combiner.

In accordance with the present disclosure, there is further provided a laser diode assembly comprising an array of N laser diode subassemblies described above, disposed for emitting N optical beams propagating in a common fourth plane, wherein each laser diode subassembly has a sequential array index from 1 to N in the array of N laser diode subassemblies;

an array of N combining reflectors, wherein each combining reflector has a sequential array index from 1 to N in the array of N combining reflectors, wherein each combining reflector of the array is disposed in the fourth plane to reflect the optical beam of the laser diode subassembly having the same array index and to transmit optical beams from other laser diode subassemblies having lower array indices, if any, thereby forming a combined beam, wherein the N combining reflectors comprise low-pass or high-pass dichroic reflectors, each dichroic reflector having a corresponding edge wavelength, wherein the edge wavelengths of the N combining reflectors are monotonically increasing or decreasing, respectively, with the combining reflector's array index; and a common partial reflector instead of the partial reflectors of the N laser diode subassemblies, wherein the common partial reflector is disposed in an optical path of the combined beam downstream of the array of N combining reflectors and arranged to reflect a portion of each light sub-beam comprising the combined beam to propagate back to its originating laser diode emitter, thereby forming a laser cavity for each laser diode emitter of the N arrays of M laser diode emitters.

In accordance with the present disclosure, there is further provided a method for generating light, the method comprising:

(a) providing an array of M laser diode emitters and disposing the M laser diode emitters for emitting M light sub-beams propagating in a common first plane, wherein each laser diode emitter has a sequential array index from 1 to M in the array of M laser diode emitters;

(b) providing an array of M dichroic reflectors, wherein each dichroic reflector has a sequential array index from 1 to M in the array of M dichroic reflectors, and disposing each dichroic reflector in the first plane to reflect the light sub-beam of the laser diode emitter having the same array index and to transmit light sub-beams from other laser diode emitters having lower array indices, if any, thereby forming an optical beam, wherein the M dichroic reflectors comprise low-pass reflectors or high-pass reflectors, each dichroic reflector having a corresponding edge wavelength, wherein the edge wavelengths of the M dichroic reflectors are monotonically increasing or decreasing, respectively, with the dichroic reflector's array index;

(c) providing a partial reflector, and arranging the partial reflector downstream of the array of M dichroic reflectors in an optical path of the optical beam, to reflect a portion of each sub-beam comprising the optical beam to propagate back to its originating laser diode emitter, thereby forming a laser cavity for each one of the M laser diode emitters; and (d) energizing the array of M laser diode emitters.

BRIEF DESCRIPTION OF THE DRAWINGS

Exemplary embodiments will now be described in conjunction with the drawings, in which:

FIG. 1 illustrates a schematic block diagram of a prior-art laser diode light source;

FIG. 2A illustrates a schematic top view of a laser diode subassembly of the present disclosure;

FIG. 2B illustrates transmission spectra of dichroic mirrors of the laser diode subassembly of FIG. 2A, correlated with positions of the dichroic mirrors in an optical train of the laser diode subassembly of FIG. 2A;

FIG. 3A illustrates a schematic top view of a laser diode assembly including two subassemblies of FIG. 2A, an optical combiner, and a common partial reflector;

FIG. 3B illustrates a schematic view of a partially reflecting mirror for use in the laser diode assembly of FIG. 3A;

FIG. 3C illustrates a schematic view of wavelength-selective VBG for use in the laser diode assembly of FIG. 3A;

FIG. 4A illustrates a schematic top view of a laser diode assembly including a plurality of subassemblies of FIG. 2A, a plurality of high-pass dichroic reflectors, and a common partial reflector;

FIG. 4B illustrates transmission spectra showing edge wavelength positions of the high-pass dichroic reflectors of FIG. 4A;

FIG. 5A illustrates a schematic top view of a laser diode assembly including a plurality of subassemblies of FIG. 2A, a plurality of bandpass dichroic reflectors, and a common partial reflector;

FIG. 5B illustrates transmission spectra of the bandpass dichroic reflectors of

FIG. 5A; and

DETAILED DESCRIPTION

Figure 6:
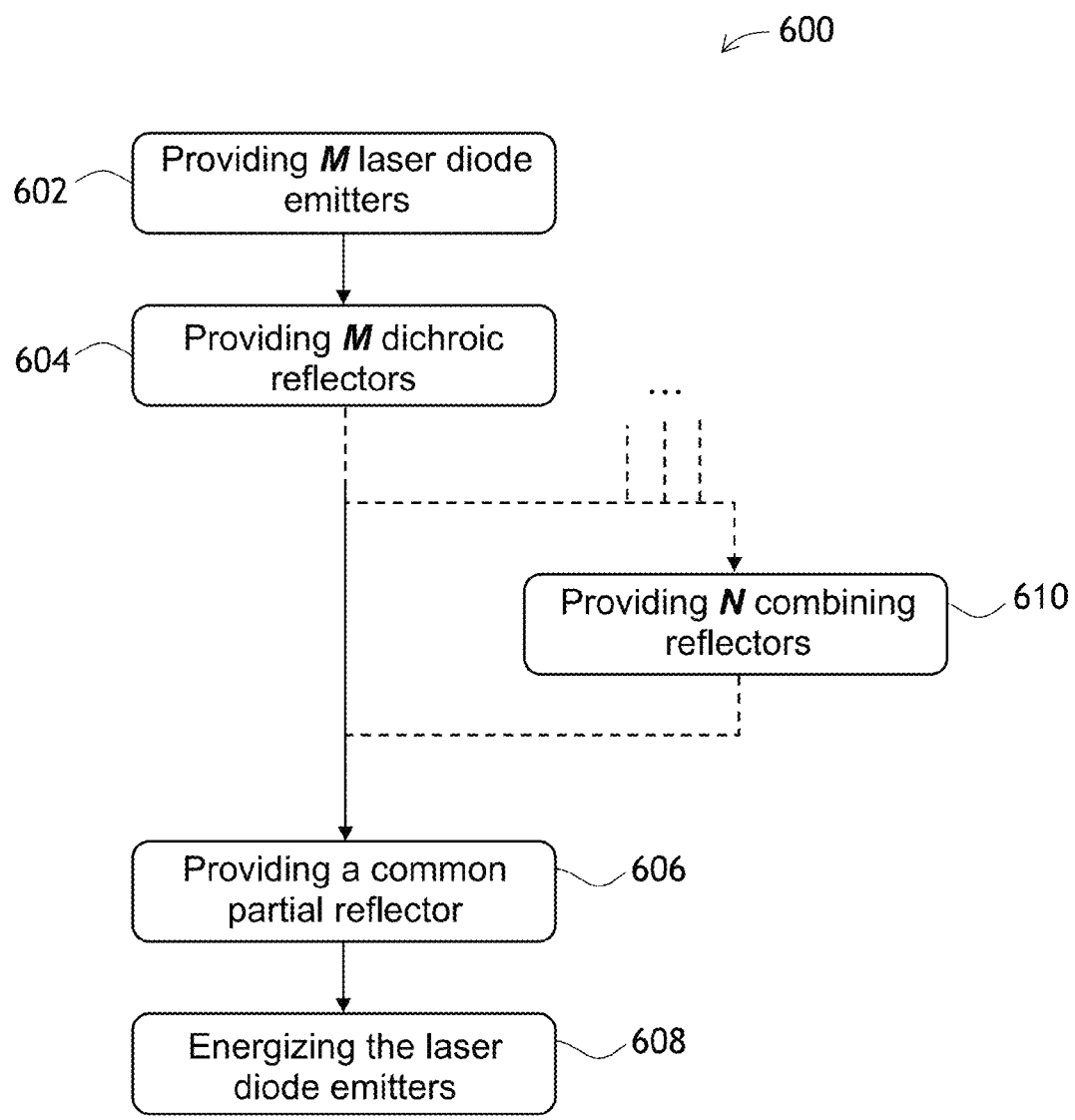
FIG. 6 illustrates a flow chart of a method for generating light according to the present disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art.

Referring to FIG. 2A, a laser diode subassembly 200 may be provided as described below. For example, the laser diode subassembly 200 may include an array 202 of M laser diode emitters 202-1, 202-2, 202-3, 202-4, 202-5, 202-6 . . . 202-M, where M is an integer >1. For convenience, the M laser diode emitters 202-1 . . . 202-M have an array index from 1 to M. Herein and throughout the specification, the term "array index" merely denotes an identifier, much like a reference numeral; of course, an actual array index needs not be physically present on or near a particular emitter or another device, in respect of which the term "array index" is used in the present disclosure. The M laser diode emitters 202-1 . . . 202-M are disposed for emitting respective M light sub-beams 204-1 . . . 204-M propagating in a common "first" plane 206.

An array 208 of M dichroic reflectors 208-1, 208-2, 208-3, 208-4, 208-5, 208-6 . . . 208-M, i.e. having array indices from 1 to M, may be provided. Each dichroic reflector 208-1 . . . 208-M may be disposed in the first plane 206 to reflect a particular one of the light sub-beams 208-1 . . . 208-M, specifically the sub-beam of the laser diode emitter having the same array index, to propagate via dichroic reflectors of the array 208 having higher array indices, if any, thereby forming an optical beam 212. In other words, each dichroic reflector 208-1 . . . 208-M is disposed in the first plane 206 to reflect the light sub-beam 208-*m* of the laser diode emitter having the same array index m and to transmit light sub-beams from other laser diode emitters having lower array indices m, if any, thereby forming the optical beam 212. Herein, m=1 . . . M.

For example, the first sub-beam 204-1 emitted by the first laser diode emitter 202-1 is reflected by the first dichroic reflector 208-1 to propagate via the dichroic reflectors 208-2 . . . 208-M; the second sub-beam 204-2 emitted by the second laser diode emitter 202-2 is reflected by the second dichroic reflector 208-2 to propagate via the dichroic reflectors 208-3 . . . 208-M; the third sub-beam 204-3 emitted by the third laser diode emitter 202-3 is reflected by the third dichroic reflector 208-3 to propagate via the dichroic reflectors 208-4 . . . 208-M; and so on. The last sub-beam 204-M emitted by the last laser diode emitter 202-M is reflected by the last dichroic reflector 208-M and does not propagate through another dichroic reflector. The first dichroic reflector 208-1 does not transmit any sub-beams, and may be replaced by a regular mirror.

The M dichroic reflectors 208-1 . . . 208-M may be all low-pass reflectors or high-pass reflectors. In the embodiment shown in FIG. 2B, the M dichroic reflectors 208-1 . . . 208-M are all low-pass reflectors, for illustration purposes. Each dichroic reflector 208-1 . . . 208-M has a corresponding edge wavelength) $\lambda_m$=1 . . . M. The edge wavelengths of the M dichroic reflectors 208-1 . . . 208-M are monotonically increasing with the reflector array index, as shown in FIG. 2B. For a case where the M dichroic reflectors 208-1 . . . 208-M are high-pass reflectors, the edge wavelengths $\lambda_m$ are monotonically decreasing.

A partial reflector 210 may be disposed downstream of the array of M dichroic reflectors 208-1 . . . 208-M in an optical path 211 of the optical beam 212, for reflecting a pre-defined portion of each sub-beam 204-1 . . . 204-M to propagate back to the corresponding laser diode emitter 202-1 . . . 202-M, thereby forming a laser cavity for each one of the M laser diode emitters 202-1 . . . 202-M. In one embodiment, the partial reflector 210 includes a VBG or a series of VBGs for defining emission wavelengths of each laser diode emitter 202-1 . . . 202-M. However, the wavelength selectivity of the partial reflector 210 may not be necessary. Since the M dichroic reflectors 208-1 . . . 208-M are disposed so as to provide an optical feedback at a particular wavelength not overlapping with wavelengths of other dichroic reflectors of the array 208, the partial reflector 210 may include a partially reflecting mirror, which by itself may be spectrally flat. The wavelength selectivity of the array of M dichroic reflectors 208-1 . . . 208-M results from spectral filtering effect of wavelength-selective reflection and wavelength-selective transmission. By way of an illustrating example, the wavelength-selective reflection of the second mirror 204-2 is combined with the cumulative spectral filtering effect of those dichroic mirrors through which the second sub-beam 204-2 propagates, that is, third to $M^{th}$ mirrors 208-3 . . . 208-M. The emission wavelength of the last laser diode emitter 202-M may be defined by the spectrally selective reflection form the last dichroic mirror 208-M and an edge wavelength of the gain band of the active medium of the last laser diode emitter 202-M.

The dichroic reflectors 208-1 . . . 208-M do not have to operate in both polarizations of light. The emission of the laser diode emitters is typically linearly polarized, so that the wavelength selective properties of the dichroic reflectors 208-1 . . . 208-M need to be defined for only one polarization. This relaxes design requirements for the dichroic reflectors 208-1 . . . 208-M, enabling them to operate at angles of incidence of about 45 degrees, as shown in FIG. 2A. In other words, each one of the array of M dichroic reflectors 208-1 . . . 208-M may be disposed at an angle of approximately 45 degrees, e.g. 45±10 degrees, with respect to the optical beam 212. Other angles of incidence may of course be used, e.g. between 30 and 60 degrees, in any convenient configuration. The compact placement of the laser diode emitters 202-1 . . . 202-M enables a relatively large number of emitters to be packed in a tight space. By way of a non-limiting example, at least 12 laser diode emitters 202-1 . . . 202-M may be used, that is, M is at least 12. In another embodiment, the number of emitters M may be 24 and higher.

Still referring to FIG. 2A, the M laser diode emitters 202-1 . . . 202-M of the laser diode subassembly 200 typically include planar laser diode chips, emission of which quickly diverges in a "third" plane (not shown) perpendicular to the laser diode chips substrate, not shown. By way of a non-limiting example, when the laser diode chips 202-1 . . . 2.202-M are disposed parallel to the first plane 206, the third plane may be perpendicular to the first plane 206 and parallel to the laser diode beams 204-1 . . . 204-M. To collimate the laser diode beams 204-1 . . . 204-M in the third plane, each laser diode emitter 202-1 . . . 202-M may include a fast-axis collimating lens. Since the laser diode emitters 202-1 . . . 202-M are disposed next to each other as shown in FIG. 2A, the fast-axis collimating lenses may be combined into a single fast-axis collimating lens 214. Each one of the M laser diode emitters 202-1 . . . 202-M may further include a slow-axis collimating lens 216-1 . . . 216-M for collimating the corresponding sub-beams 204-1 . . . 204-M in the first plane 206.

The M laser diode emitters 202-1 . . . 202-M may be disposed in a common "second" plane, not shown, which may not be parallel to the first plane 206, because output facets of the M laser diode emitters 202-1 . . . 202-M may be angled to avoid backreflections. As well known to a person skilled in the art, the light sub-beams 204-1 . . . 204-M emitted from angled facets will be emitted at an angle to a plane of the laser diode chip.

Turning to FIG. 3A with further reference to FIG. 2A, a laser diode assembly 300 (FIG. 3A) includes two laser diode subassemblies 200 (FIG. 2A). In operation, a first array 301 of M laser diode emitters (FIG. 3A) forms a first optical beam 311, and a second array 302 of M laser diode emitters forms a second optical beam 312. An optical combiner 308 may be provided for combining the first 311 and second 312 optical beams into a combined beam 320. A common partial reflector 310A may be provided instead of the partial reflectors 210 of the two laser diode subassemblies 200. The common partial reflector 310A is disposed in an optical path 322 of the combined beam 320 downstream of the optical combiner 308 for retroreflecting each sub-beam 204-1 . . . 204-M of the first 301 and second 302 arrays of M laser diode emitters, thereby forming a laser cavity for each laser diode emitter of the first 301 and second 302 arrays of M laser diode emitters.

In FIG. 3A, the optical combiner 308 includes a polarization beam combiner e.g. a polarizing cube. The first optical beam 311 has a p-polarization 314. The second beam 312 has the p-polarization 314 before a half-wave plate 315, and an s-polarization 316 after the half-wave plate 315. The optical combiner 308 combines the first 311 and second 312 beams into the combined beam 320, which is randomly polarized. In another embodiment, the optical combiner 308 includes a dichroic reflector for reflecting the second optical beam 312, while transmitting the first optical beam 311. For this case, of course, the first 311 and second 312 optical beams need to be spectrally distinct.

Referring to FIG. 3B, the common partial reflector 310A may include a partially reflecting mirror 310B, e.g. a translucent spectrally flat mirror. In another embodiment shown in FIG. 3C, the common partial reflector 310A may include a VBG reflector 310C for providing a wavelength-selective reflection of individual sub-beams 204-1 ... 204-M of the first 301 and second 302 arrays of M laser diode emitters. To that end, the VBG reflector 310C may include a plurality of sequentially disposed regions 317, 318, 319 for reflecting different wavelengths of light. The partially reflecting mirror 310B and the VBG reflector 310C may also replace, or be included in, the partial reflector 210 of the laser diode subassembly 200 of FIG. 2A.

Turning now to FIG. 4A with further reference to FIG. 2A, a laser diode assembly 400 may include an array of N laser diode subassemblies sequentially numbered with array indices from 1 to N i.e. 200-1 ... 200-N, where N is an integer >1. Only three laser subassemblies, 200-1, 200-2, and 200-3 are shown in FIG. 4A for brevity. The N laser diode subassemblies 200-1 ... 200-N correspond to the laser diode subassembly 200 of FIG. 2A.

In operation, the corresponding N arrays of M laser diode emitters 202-1 ... 202-M emit N optical beams 412-1 ... 412-N propagating in a common "fourth" plane 406, that is, the plane of FIG. 4A. An array 410 of N combining reflectors having array indices from 1 to N i.e. 410-1 ... 410-N is provided. Only three optical beams 412-1, 412-2, and 412-3; and only three combining reflectors 410-1, 410-2, and 410-3 are shown in FIG. 4A for brevity. Each combining reflector 410-1 ... 410-N of the array 410 is disposed in the fourth plane 406 to reflect a corresponding one of N optical beams 412-1 ... 412-N to propagate via those of the combining reflectors 410-1 ... 410-N of the array 410 which have higher array indices, if any, so as to form a combined beam 420. In other words, each combining reflector 410-1 ... 410-N of the array is disposed in the fourth plane 406 to reflect the optical beam of the laser diode subassembly 200-$n$ having the same array index n and to transmit optical beams from other laser diode subassemblies having lower array indices, if any, thereby forming the combined beam 420.

For example, the first optical beam 412-1 having a first spectral band 414-1 is reflected by the first combining reflector 410-1 to propagate through the second combining reflector 412-2, the third combining reflector 412-3, and so on, to the $N^{th}$ combining reflector 410-N. The second optical beam 412-2 having a second spectral band 414-2 is reflected by the second combining reflector 410-2 to propagate through the third 412-3 to the $N^{th}$ combining reflector 410-N. The third optical beam 412-3 having a third spectral band 414-3 is reflected by the third combining reflector 410-3.

In the embodiment shown, the N combining reflectors 410-1 ... 410-N include high-pass dichroic reflectors each having a corresponding edge wavelength. The edge wavelengths of the N combining reflectors are monotonically decreasing, respectively, with the reflector array index. For instance, referring to FIG. 4B, transmission functions 416-1, 416-2, and 416-3 correspond to the combining reflectors 410-1, 410-2, and 410-3, respectively. The first spectral band 414-1 is not transmitted but reflected by the first combining reflector 410-1 having the transmission function 416-1, and is transmitted by the second 410-2 and third 410-3 combining reflectors having the respective transmission functions 416-2 and 416-3. The second spectral band 414-2 is not transmitted but reflected by the second combining reflector 410-2, and is transmitted by the third combining reflector 410-3. The third spectral band 414-3 is reflected by the third combining reflector 410-3.

A common partial reflector 440 may be provided instead of the partial reflectors 210 of the N laser diode subassemblies (FIG. 2A). The common partial reflector 440 (FIG. 4A) may be disposed in an optical path 422 of the combined beam 420 downstream of the array 410 of N combining reflectors for retroreflecting a portion of each sub-beam 204-1 ... 204-M (FIG. 2A), thereby forming a laser cavity for each laser diode emitter 202-1 ... 202-M of the N arrays of M laser diode emitters. The numbers M and N may vary. In a preferred embodiment, M is at least 12 and N is at least 4.

An optional polarization beam combiner 408 may be provided for polarization combining the corresponding two combined beams 420 of two laser diode assemblies 400 (only one is shown in FIG. 4A) into an output optical beam 450. For this laser diode apparatus embodiment, the common partial reflector 440 may be provided downstream of the polarization beam combiner 408. As in case of the laser diode assembly 300 of FIG. 3A, the common partial reflector 440 may include the partially reflecting mirror 310B (FIG. 3B) and/or the VBG reflector 310C (FIG. 3C). The partially reflecting mirror 310B may be non-dichroic, that is, a spectrally flat mirror.

Referring now to FIG. 5A with further reference to FIG. 4A, a laser diode assembly 500 is similar to the laser diode assembly 400 of FIG. 4A. One difference of the laser diode assembly 500 of FIG. 5A as compared with the laser diode assembly 400 of FIG. 4A is that in the laser diode assembly 500 of FIG. 5A, bandpass combining reflectors 510-1, 510-2, 510-3, 510-4, ... 510-N (only four first shown) are used instead of high-pass combining reflectors 410-1, 410-2, 410-3 ... 410-N. The bandpass dichroic reflectors 510-1, 510-2, 510-3, 510-4, ... 510-N may be used to combine two of optical beams 512-1, 512-2, 512-3, 512-4 ... 512-N generated by the laser diode subassemblies 200-1, 200-2, 200-3, 200-4 ... 200-N etc. at a time. For example, in FIG. 5A the first bandpass combining reflector 510-1 combines the first output beam 512-1 with an output beam from another laser diode subassembly, not shown; the second bandpass combining reflector 510-2 combines the resulting optical beam with the second output beam 512-2; the third bandpass combining reflector 510-3 combines the resulting optical beam with the third optical beam 512-3; the fourth bandpass combining reflector 510-4 combines the resulting optical beam with the fourth optical beam 512-4; and so on. FIG. 5B illustrates a transmission spectrum 516-3 of the third bandpass combining reflector 510-3, showing how spectral bands 514-1 and 514-3 may be combined by the third bandpass combining reflector 510-3.

Turning to FIG. 6 with further reference to FIG. 2A, a method 600 (FIG. 6) for generating light includes a step 602 of providing the array 202 of M laser diode emitters 202-1 ... 202-M (FIG. 2A) having sequential array indices from 1 to M, and disposing the M laser diode emitters 202-1 ... 202-M for emitting the M light sub-beams 204-1 ... 204-M propagating in the common first plane 206.

In a next step 604 (FIG. 6), the array 208 (FIG. 2A) of M dichroic reflectors 208-1 ... 208-M is provided. The M dichroic reflectors 208-1 ... 208-M having sequential array indices from 1 to M. In this step, each dichroic reflector 208-1 ... 208-M is disposed in the first plane 206 to reflect the sub-beam 204-$m$ of the laser diode emitter 202-$m$ having the same array index m, to propagate via dichroic reflectors 208-$m$+1 ... 208-M of the array having higher array indices m+1 ... M (if any), thereby forming the optical beam 212. In other words, each dichroic reflector 208-1 ... 208-M is disposed in the first plane 206 to reflect the light sub-beam 204-m of the laser diode emitter having the same array index m and to transmit light sub-beams from other laser diode emitters having lower array indices, if any, thereby forming the optical beam 212. As explained above with reference to FIG. 2A, the M dichroic reflectors 208-1 . . . 208-M may include low-pass reflectors or high-pass reflectors, each dichroic reflector 208-1 . . . 208-M having a corresponding edge wavelength) $\lambda_m$=1 . . . M. The edge wavelengths $\lambda_m$ of the M dichroic reflectors are monotonically increasing with the reflector array index m for the case of low-pass reflectors, or decreasing with the reflector array index m for the case of high-pass reflectors.

In a next step 606 (FIG. 6), the partial reflector 210 is provided and disposed downstream of the array 208 of M dichroic reflectors 208-1 . . . 208-M in the optical path 211 of the optical beam 212, for reflecting a portion of each sub-beam 204-1 . . . 204-M to propagate back to the corresponding laser diode emitter 202-1 . . . 202-M, thereby forming a laser cavity for each one of the M laser diode emitters 202-1 . . . 202-M. Then, in a last step 608, the array 202 of M laser diode emitters 202-1 . . . 202-M is energized.

The method 600 may be extended for generating light using e.g. the laser diode assembly 400 of FIG. 4A. Still referring to FIG. 6 with further reference to FIGS. 2A and 4A, the first two steps 602, 604 of the method 600 may be repeated as denoted with dashed lines in FIG. 6, to provide an array of N laser diode subassemblies 200-1 . . . 200-N (FIG. 4A) having sequential array indices from 1 to N, each laser diode subassembly 200-1 . . . 200-N including the array 202 of M laser diode emitters 202-1 . . . 202-M having sequential array indices from 1 to M, and the array 208 of M dichroic reflectors 208-1 . . . 208-M having sequential array indices from 1 to M. As described above with reference to FIGS. 2A and 4A, each dichroic reflector 208-1 . . . 208-M is disposed to reflect the sub-beam 204-1 . . . 204-M emitted by the corresponding laser diode emitter 202-1 . . . 202-M to propagate via dichroic reflectors of the same array having higher array indices, if any, so as to form N combined beams propagating in the common fourth plane 406.

In a step 610, the array 410 of N combining reflectors 410-1 . . . 410-N, having sequential array indices from 1 to N, may be provided and disposed in the fourth plane 406 (FIG. 4A) to reflect a corresponding one of the N optical beams 412-1 . . . 412-N to propagate via combining reflectors 410-1 . . . 410-N having higher array indices, if any, so as to form the combined beam 420. As explained above with reference to FIG. 4A, the N combining reflectors 410-1 . . . 410-N of the array 410 may include low-pass or high-pass dichroic reflectors, each dichroic reflector having a corresponding edge wavelength. The edge wavelengths of the N combining reflectors 410-1 . . . 410-N may be monotonically increasing with the reflector array index for the case of low-pass reflectors, or decreasing with the reflector array index for the case of high-pass reflectors.

In this embodiment, the common partial reflector 440 (FIG. 4A) is provided in the step 606 instead of the partial reflectors 210 (FIG. 2A) of the N laser diode subassemblies 200-1 . . . 200-N (FIG. 4A). The common partial reflector 440 may be disposed in the optical path 422 of the combined beam 420 downstream of the array 410 of N combining reflectors 410-1 . . . 410-N for retroreflecting a portion of each sub-beam, thereby forming a laser cavity for each laser diode emitter 202-1 . . . 202-M of the N arrays 200-1 . . . 200-N of M laser diode emitters. Then, in the last step 608, the N arrays of M laser diode emitters 202-1 . . . 202-M are energized.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A laser diode subassembly comprising:
   an array of M laser diode emitters disposed for emitting M light sub-beams propagating in a common first plane, wherein each laser diode emitter has a sequential array index from 1 to M in the array of M laser diode emitters;
   an array of M dichroic reflectors, wherein each dichroic reflector has a sequential array index from 1 to M in the array of M dichroic reflectors,
   wherein each dichroic reflector is disposed in the common first plane to reflect a light sub-beam of a laser diode emitter having a same array index and to transmit light sub-beams from other laser diode emitters having lower array indices, if any, thereby forming an optical beam,
   wherein the M dichroic reflectors comprise low-pass reflectors or high-pass reflectors, each dichroic reflector having a corresponding edge wavelength, wherein the edge wavelengths of the M dichroic reflectors are monotonically increasing or decreasing, respectively, with the dichroic reflector's array index; and
   a partial reflector disposed downstream of the array of M dichroic reflectors in an optical path of the optical beam and arranged to reflect a portion of each light sub-beam comprising the optical beam to propagate back to its originating laser diode emitter, thereby forming a laser cavity for each one of the M laser diode emitters.

2. The laser diode subassembly of claim 1, wherein the partial reflector comprises a partially reflecting mirror.

3. The laser diode subassembly of claim 1, wherein the partial reflector comprises a wavelength-selective volume Bragg reflector.

4. The laser diode subassembly of claim 1, wherein each one of the array of M dichroic reflectors is disposed at an angle of 45 degrees±10 degrees with respect to the optical beam.

5. The laser diode subassembly of claim 1, wherein each one of the M laser diode emitters comprises a planar laser diode chip and a fast-axis collimating lens for collimating a corresponding sub-beam in a third plane perpendicular to the common first plane.

6. The laser diode subassembly of claim 5, wherein the planar laser diode chips of the M laser diode emitters are disposed in a common second plane, wherein the fast-axis collimating lenses of the laser diode emitters comprise portions of a common fast-axis collimating lens extending parallel to the common second plane.

7. The laser diode subassembly of claim 6, wherein each one of the M laser diode emitters further comprises a slow-axis collimating lens for collimating a corresponding sub-beam in the common first plane.

8. The laser diode subassembly of claim 1, wherein M is at least 12.

9. A laser diode assembly comprising two laser diode subassemblies of claim 1, wherein in operation, a first one of two arrays of M laser diode emitters forms a first optical beam, and a second one of two arrays of M laser diode emitters forms a second optical beam;
- an optical combiner for combining the first and second optical beams into a combined beam; and
- a common partial reflector instead of the partial reflectors of the two laser diode subassemblies, wherein the common partial reflector is disposed in an optical path of the combined beam downstream of the optical combiner for retroreflecting each light sub-beam, thereby forming a laser cavity for each laser diode emitter of the two arrays of M laser diode emitters.

10. The laser diode assembly of claim 9, wherein the optical combiner comprises a dichroic reflector for reflecting the second optical beam, while transmitting the first optical beam.

11. The laser diode assembly of claim 9, wherein the optical combiner comprises a polarization beam combiner for reflecting the second optical beam, while transmitting the first optical beam.

12. The laser diode assembly of claim 9, wherein the common partial reflector comprises a partially reflecting mirror.

13. The laser diode assembly of claim 9, wherein the common partial reflector comprises a wavelength-selective volume Bragg reflector.

14. A laser diode assembly comprising an array of N laser diode subassemblies of claim 1, disposed for emitting N optical beams propagating in a common fourth plane, wherein each laser diode subassembly has a sequential array index from 1 to N in the array of N laser diode subassemblies;
- an array of N combining reflectors, wherein each combining reflector has a sequential array index from 1 to N in the array of N combining reflectors,
- wherein each combining reflector is disposed in the common fourth plane to reflect the optical beam of the laser diode subassembly having the same array index and to transmit optical beams from other laser diode subassemblies having lower array indices, if any, thereby forming a combined beam,
- wherein the N combining reflectors comprise low-pass or high-pass dichroic reflectors, each dichroic reflector having a corresponding edge wavelength, wherein the edge wavelengths of the N combining reflectors are monotonically increasing or decreasing, respectively, with the combining reflector's array index; and
- a common partial reflector instead of the partial reflectors of the N laser diode subassemblies, wherein the common partial reflector is disposed in an optical path of the combined beam downstream of the array of N combining reflectors and arranged to reflect a portion of each light sub-beam comprising the combined beam to propagate back to its originating laser diode emitter, thereby forming a laser cavity for each laser diode emitter of N arrays of M laser diode emitters.

15. The laser diode assembly of claim 14, wherein M is at least 12 and N is at least 4.

16. A laser diode apparatus comprising two laser diode assemblies of claim 14 and a polarization beam combiner for combining two combined beams into an output optical beam, the laser diode assembly further comprising a common partial retroreflector instead of the common partial reflectors of the two laser diode assemblies, wherein the common partial retroreflector is disposed in an optical path of the output optical beam downstream of the polarization beam combiner, and arranged to reflect a portion of each light sub-beam comprising the output optical beam, thereby forming a laser cavity for each laser diode emitter of the N arrays of M laser diode emitters.

17. The laser diode assembly of claim 16, wherein the common partial retroreflector comprises a partially reflecting mirror.

18. The laser diode assembly of claim 16, wherein the common partial retroreflector comprises a wavelength-selective volume Bragg reflector.

19. A method for generating light, the method comprising:
- (a) providing an array of M laser diode emitters and disposing the M laser diode emitters for emitting M light sub-beams propagating in a common first plane, wherein each laser diode emitter has a sequential array index from 1 to M in the array of M laser diode emitters;
- (b) providing an array of M dichroic reflectors, wherein each dichroic reflector has a sequential array index from 1 to M in the array of M dichroic reflectors, and disposing each dichroic reflector in the common first plane to reflect a light sub-beam of a laser diode emitter having a same array index and to transmit light sub-beams from other laser diode emitters having lower array indices, if any, thereby forming an optical beam,
- wherein the M dichroic reflectors comprise low-pass reflectors or high-pass reflectors, each dichroic reflector having a corresponding edge wavelength, wherein the edge wavelengths of the M dichroic reflectors are monotonically increasing or decreasing, respectively, with the dichroic reflector's array index;
- (c) providing a partial reflector, and arranging the partial reflector downstream of the array of M dichroic reflectors in an optical path of the optical beam, to reflect a portion of each sub-beam comprising the optical beam to propagate back to its originating laser diode emitter, thereby forming a laser cavity for each one of the M laser diode emitters; and
- (d) energizing the array of M laser diode emitters.

20. The method of claim 19, further comprising
- (i) repeating steps (a) and (b) N times so as to provide an array of N laser diode subassemblies, and disposing the N laser diode subassemblies for emitting N optical beams propagating in a common fourth plane, wherein each laser diode subassembly has a sequential array index from 1 to N in the array of N laser diode subassemblies;
- (ii) providing an array of N combining reflectors, wherein each combining reflector has a sequential array index from 1 to N in the array of N combining reflectors, and disposing each combining reflector of the array in the common fourth plane to reflect the optical beam of a laser diode subassembly having a same array index and to transmit optical beams from other laser diode subassemblies having lower array indices, if any, thereby forming a combined beam,
- wherein the N combining reflectors of the array of N combining reflectors comprise low-pass or high-pass dichroic reflectors, each dichroic reflector having a corresponding edge wavelength, wherein the edge wavelengths of the N combining reflectors are monotonically increasing or decreasing, respectively, with the combining reflector's array index;
- (iii) providing a common partial reflector instead of the partial reflectors of the N laser diode subassemblies, and disposing the common partial reflector in an optical path of the combined beam downstream of the array of N combining reflectors, wherein the common partial reflector is arranged to reflect a portion of each light sub-beam comprising the combined beam to propagate back to its originating laser diode emitter, thereby forming a laser cavity for each laser diode emitter of N arrays of M laser diode emitters; and (iv) energizing the N arrays of M laser diode emitters.

* * * * *